US010177455B2

(12) United States Patent
DeLisio, Jr. et al.

(10) Patent No.: US 10,177,455 B2
(45) Date of Patent: Jan. 8, 2019

(54) SYSTEMS AND METHODS FOR DIFFERENTIAL DIPOLE-BASED WAVEGUIDE POWER COMBINING

(71) Applicant: Mission Microwave Technologies, LLC, Santa Fe Springs, CA (US)

(72) Inventors: Michael P. DeLisio, Jr., Santa Fe Springs, CA (US); Blythe C. Deckman, Santa Fe Springs, CA (US); Jason W. May, Santa Fe Springs, CA (US)

(73) Assignee: Mission Microwave Technologies, LLC, Santa Fe Springs, CA (US)

( * ) Notice: Subject to any disclaimer, the term of this patent is extended or adjusted under 35 U.S.C. 154(b) by 0 days.

(21) Appl. No.: 16/046,439

(22) Filed: Jul. 26, 2018

(65) Prior Publication Data

US 2018/0358705 A1    Dec. 13, 2018

Related U.S. Application Data

(63) Continuation of application No. 15/198,784, filed on Jun. 30, 2016, now Pat. No. 10,038,247.

(60) Provisional application No. 62/188,326, filed on Jul. 2, 2015.

(51) Int. Cl.
*H01Q 9/16* (2006.01)
*H03F 3/60* (2006.01)
*H01P 5/12* (2006.01)
*H01P 5/107* (2006.01)
*H03F 3/24* (2006.01)
*H04B 1/04* (2006.01)

(52) U.S. Cl.
CPC ............... *H01Q 9/16* (2013.01); *H01P 5/107* (2013.01); *H01P 5/12* (2013.01); *H03F 3/24* (2013.01); *H03F 3/602* (2013.01); *H03F 2200/451* (2013.01); *H04B 2001/0408* (2013.01)

(58) Field of Classification Search
CPC ................ H01Q 9/16; H01P 5/10; H01P 5/12
USPC ......................................................... 343/793
See application file for complete search history.

(56) References Cited

U.S. PATENT DOCUMENTS 7,400,215 B2 *  7/2008  Deckman ................ H03F 3/602
                                                                                    333/125

OTHER PUBLICATIONS

Lang, Jiandong et al "A Ku-Band Eight-Way Solid-State Spatial Power-Combining Amplifier", 2010 IEEE, ICMMT 2010 Proceedings, pp. 1841-1844.

(Continued)

*Primary Examiner* — Andrea Lindgren Baltzell
(74) *Attorney, Agent, or Firm* — Christopher P. Maiorana, PC

(57) ABSTRACT

A power combiner system for use in a single-mode waveguide includes an input waveguide, an output waveguide, at least one power amplifier module that includes a plurality of amplifiers, and at least one input dipole antenna extending into the input waveguide. Each input dipole antenna includes two input dipole antenna arms, and each input dipole antenna arm is coupled to an input of a corresponding one of the plurality of amplifiers. The system further includes at least one output dipole antenna extending into the output waveguide. Each output dipole antenna includes two output dipole antenna arms, and each output dipole antenna arm is coupled to an output of a corresponding one of the plurality of amplifiers. Each power amplifier module is disposed in a plane that runs parallel with the direction of propagation.

20 Claims, 11 Drawing Sheets

(56) References Cited

OTHER PUBLICATIONS

Yin, Kang et al., "Characterization and Design of Millimeter-Wave Full-Band Waveguide-Based Spatial Power Divider/Combiner", Progress in Electromagnetic Research C, vol. 50, 2014, pp. 65-74.

* cited by examiner

SYSTEMS AND METHODS FOR DIFFERENTIAL DIPOLE-BASED WAVEGUIDE POWER COMBINING

CROSS-REFERENCE TO RELATED APPLICATION

This application relates to U.S. Ser. No. 15/198,784, filed Jun. 30, 3016, which claims the benefit of U.S. Provisional Application No. 62/188,326, filed Jul. 2, 2015, each of which is incorporated by reference in their entirety.

FIELD OF INVENTION

This disclosure generally relates to differential dipole-based waveguide power combining, and more specifically, to a power combiner system that uses power amplifier modules that include differential dipole antennas to combine power in a single mode waveguide.

BACKGROUND

Terrestrial satellite transmitter systems are used to uplink signal transmissions in satellite communications networks. Typically, a satellite transmitter system includes a power amplifier to increase the power of the signal to levels adequate to reach a distant satellite with sufficient strength. Because the output power of a single amplifying element is often not strong enough, the outputs of many amplifying elements must be combined. Additionally, as the frequency of the transmitted signal becomes higher, the cross-section of the waveguides used to convey the signals must become smaller. As a result, different methods of power combining must be employed, often using one or more printed circuit boards (PCB) to manage these higher frequency wave signals. For example, conventional waveguide designers have employed many different techniques to combine the power of a higher frequency wave signal, such as using finline antennas, slotline antennas, or waveguide probes and transitions, often launching the waves into oversized waveguides. Generally these combiners propagate the amplified wave into a waveguide and eventually radiated to a desired satellite.

For instance, one conventional power combining technique includes using solid state amplifiers with tapered finline antennas printed on a single dielectric substrate (i.e., PCB) card in the center of an oversized waveguide. Despite the use of multiple finline antennas on a single substrate card to facilitate power combining, this conventional single substrate card technique limits the scale of power combining because only a finite number of finline antennas may be printed on a single substrate card. Moreover, because an oversized waveguide is often utilized in this single card technique, the possibility of spurious resonances increases because overmoding is more likely to occur (i.e., more than one mode propagation may occur at higher frequencies). Furthermore, this technique often directly connects each amplifier to adjacent amplifiers. This direct DC couple between amplifiers increases the possibility of low frequency oscillation problems in addition to other stability problems.

Another conventional technique utilizes multiple dielectric substrate cards that include tapered slotline or probe-like antennas that only have a single-end (i.e., only one single arm of the probe antenna) coupled to a single amplifier in conjunction with an oversized waveguide. Detrimentally, this conventional single-ended configuration often requires the use of a balanced-to-unbalanced (i.e., balun) transformer or other structure to assist with converting between a balanced signal and an unbalanced signal. As a result of incorporating a balun structure in the configuration, the bandwidth may be limited and undesired reactance may be introduced into the system leading to less favorable signal quality. Moreover, a single-ended configuration cannot sufficiently suppress harmonic interference as well a differential configuration, and again, overmoding issues are prevalent for applications utilizing oversized waveguides.

Other conventional power combining techniques include using a spatial waveguide power combiner that includes multiple trays of tapered slotline antennas, with wirebond transitions from the antenna to a microstrip on a dielectric PCB card. Not only do wirebond transitions complicate the manufacturing process, but they reduce the possible bandwidth usage of the wave signal. Moreover, because this configuration requires a more gradual taper in the slotline antenna to achieve a sufficient impedance matching over a substantial bandwidth, the entire slotline module that amplifies the power must be physically longer in length which adds weight and bulk to the power amplifying module.

Yet another conventional power combining technique includes implementing a tapered slotline-to-microstrip structure in which the differentially driven microstrips couple to an amplifier for eventually combining power into an output wave signal. However, this conventional technique suffers similar problems as other conventional techniques such as requiring an increased length of the device because, as described above, the gradual tapering of the slotline helps the system to achieve sufficient matching. Furthermore, despite the amplifiers being differentially driven, the amplifiers are coupled at DC with other adjacent amplifiers which may lead to low frequency oscillations and stability problems.

SUMMARY

A power combiner system for use in a waveguide includes an input waveguide, an output waveguide, at least one power amplifier module that includes i) a plurality of amplifiers, ii) at least one input dipole antenna extending into the input waveguide, each input dipole antenna including two input dipole antenna arms, each input dipole antenna arm being coupled to an input of a corresponding one of the plurality of amplifiers, and iii) at least one output dipole antenna extending into the output waveguide, each output dipole antenna including two output dipole antenna arms, each output dipole antenna arm coupled to an output of a corresponding one of the plurality of amplifiers, and wherein each power amplifier module is disposed in a plane that runs parallel with the direction of propagation.

BRIEF DESCRIPTIONS OF THE DRAWINGS

Figure 3A:
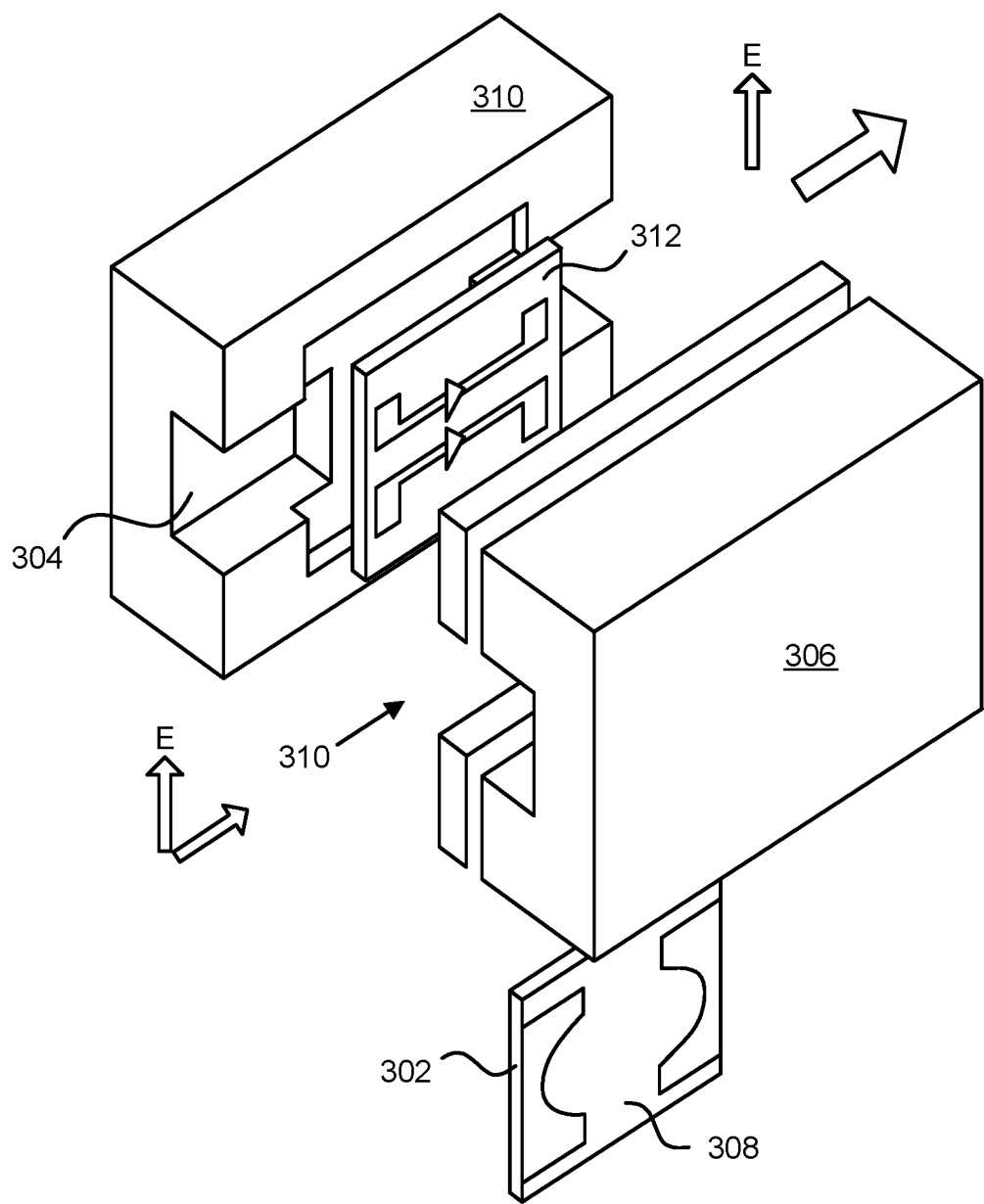
FIG. 3A illustrates an exploded view diagram of an exemplary differential dipole-based power combiner that includes two power amplifier modules in two different planes according to one embodiment of the invention.
Figure 5:
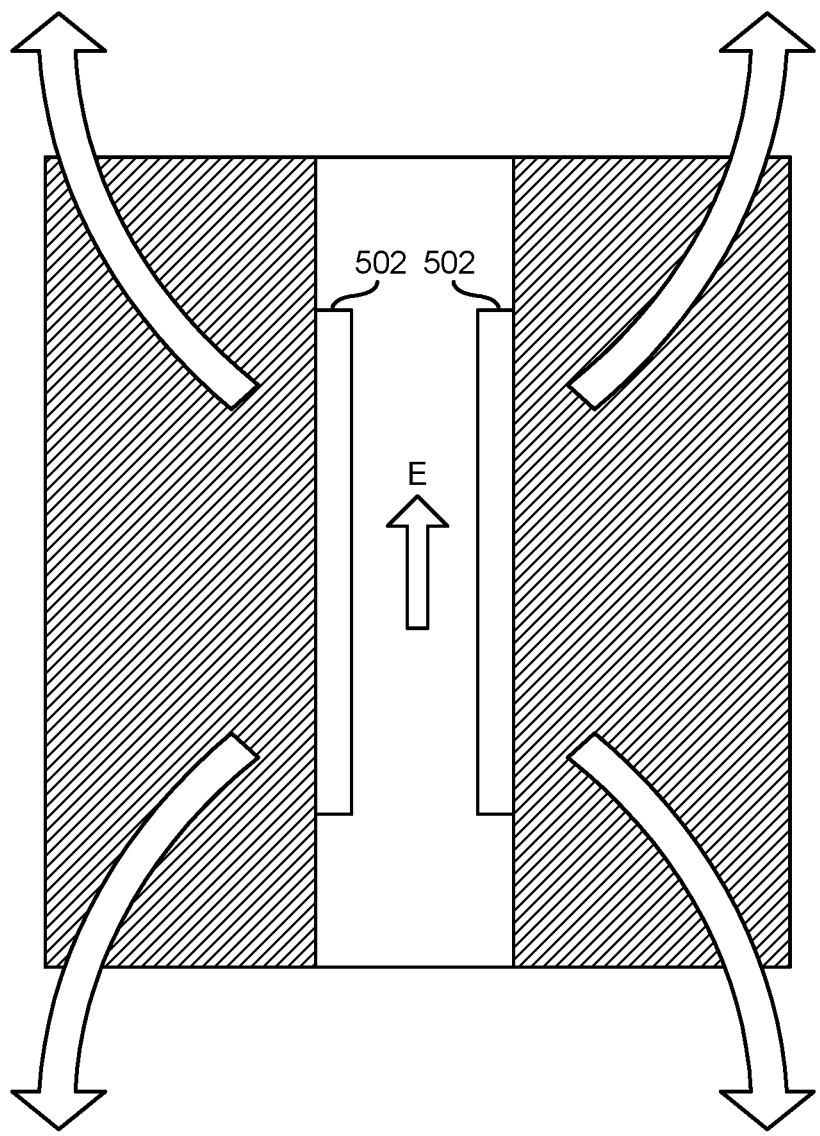

FIG. 5 illustrates an end view (i.e., view from the input waveguide into the output waveguide) diagram of an exemplary differential dipole-based waveguide power combiner, as shown in FIG. 3A, that includes two power amplifier modules disposed in the plane orthogonal to the direction of energy propagation and that dissipate heat into the metal block of the waveguide according to one embodiment of the invention.

Figure 6:
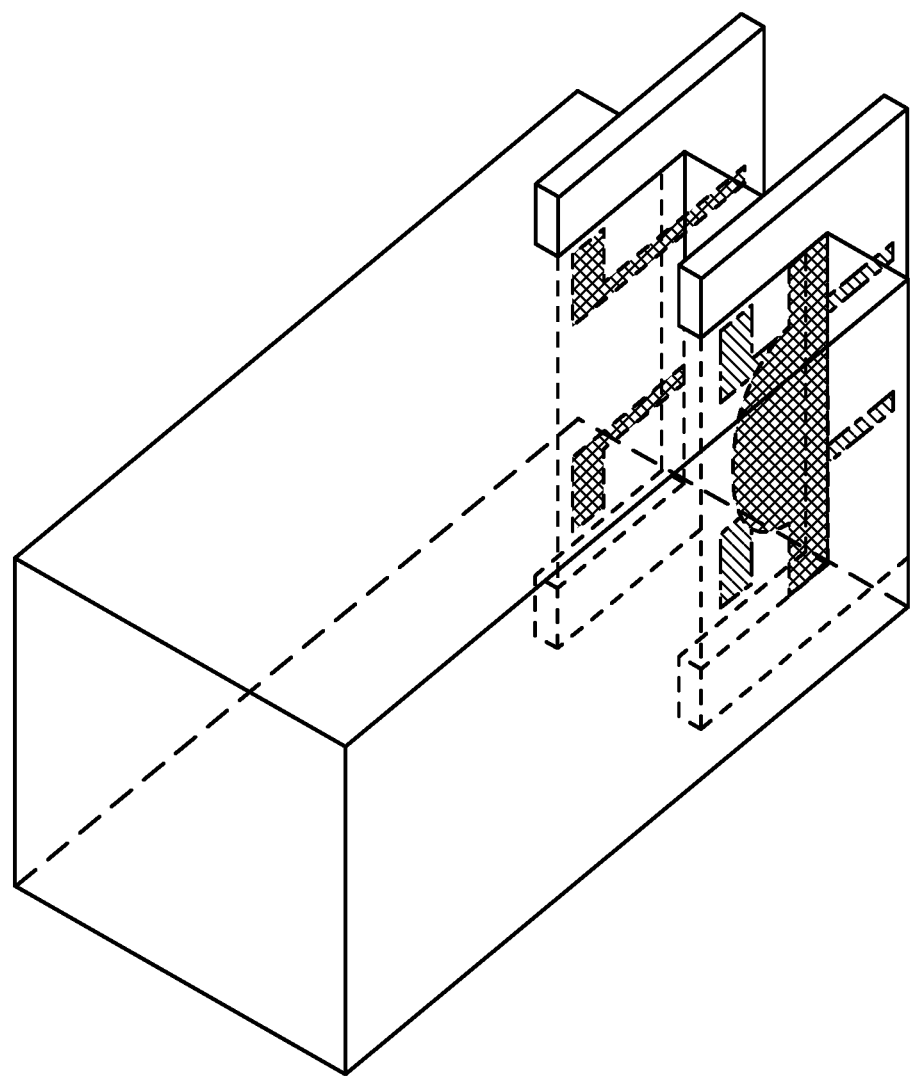

FIG. 6 depicts a three dimensional computer model view of an exemplary differential dipole-based waveguide power combiner that includes two power amplifier modules, as shown in FIG. 3A according to one embodiment of the invention.

Figure 7:
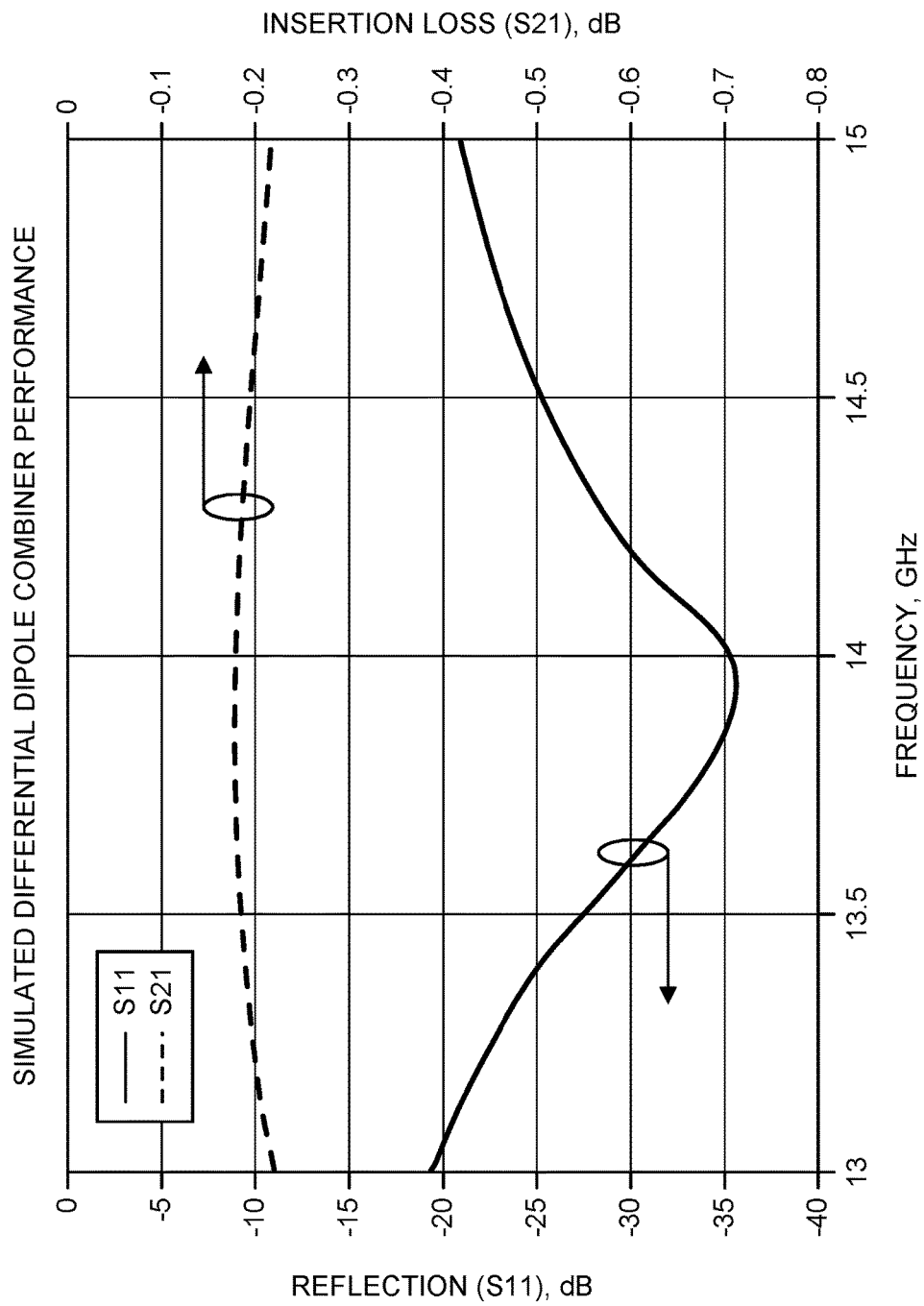

FIG. 7 depicts the simulated performance over the Ku band of the three dimensional computer model of the differential dipole-based waveguide power combiner, as shown in FIG. 6 according to one embodiment of the invention.

Figure 8:
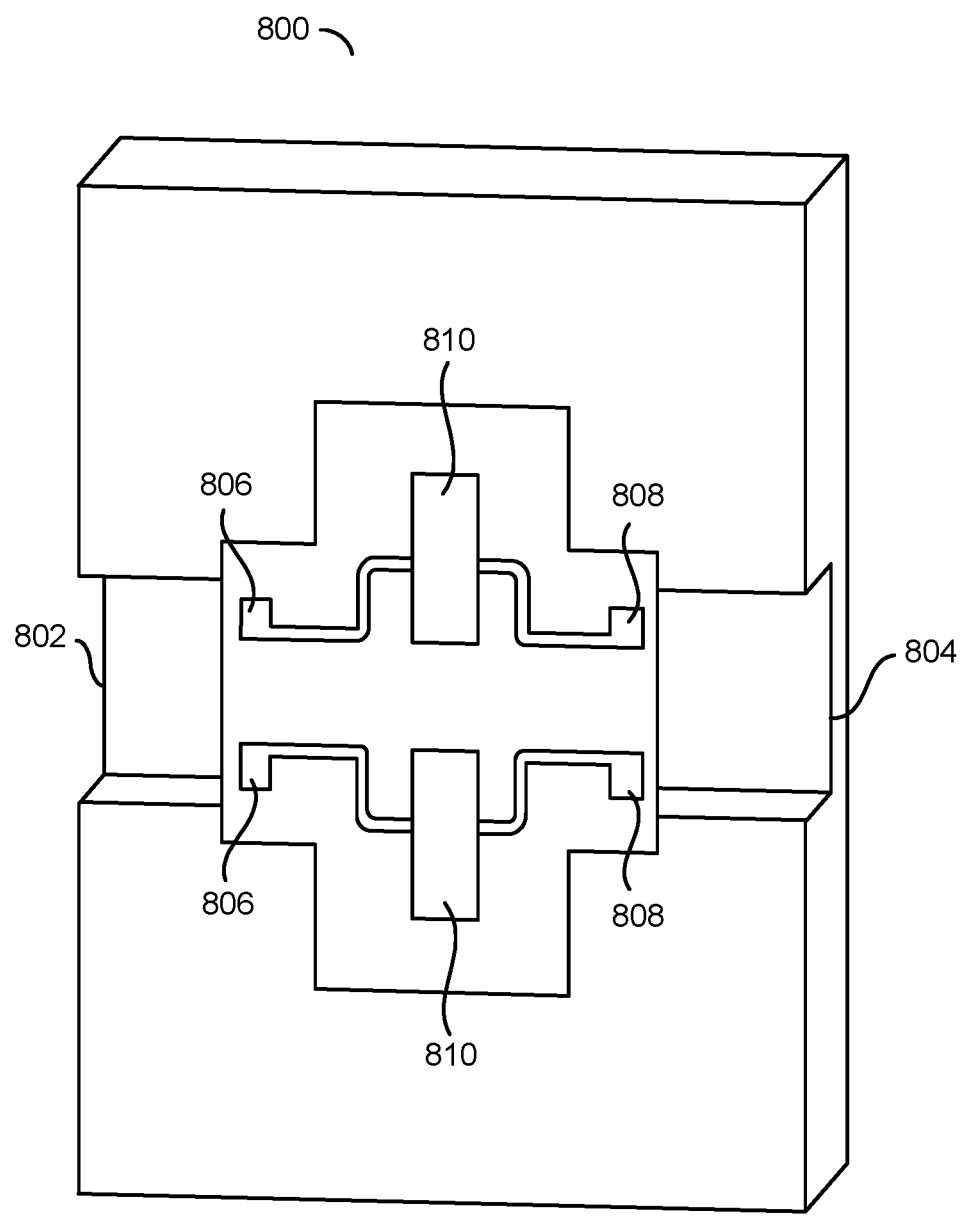

FIG. 8 depicts an exemplary differential dipole-based waveguide power combiner computer model design of a substrate formed power amplifier module as situated in a waveguide according to one embodiment of the invention.

Figure 9:
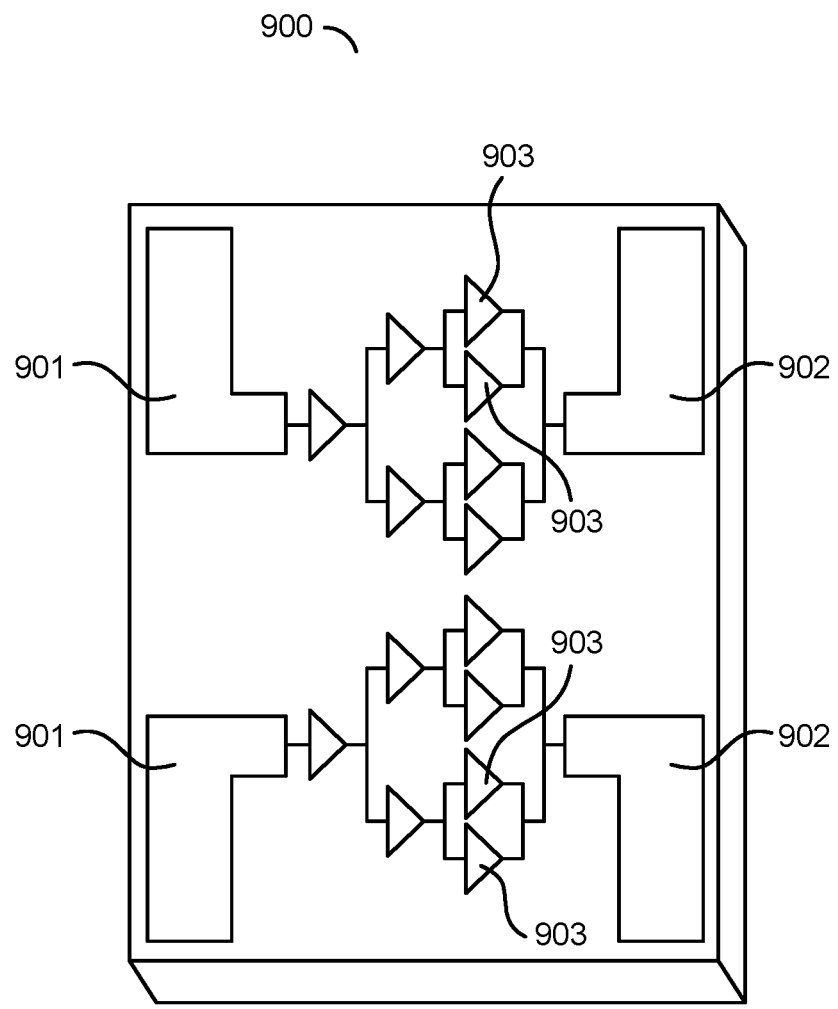

FIG. 9 depicts an exemplary differential dipole-based waveguide power combiner design of an integrated circuit formed power amplifier module, wherein the input and output dipole antennas are integrated directly on the semiconductor chip according to one embodiment of the invention.

Figure 10:
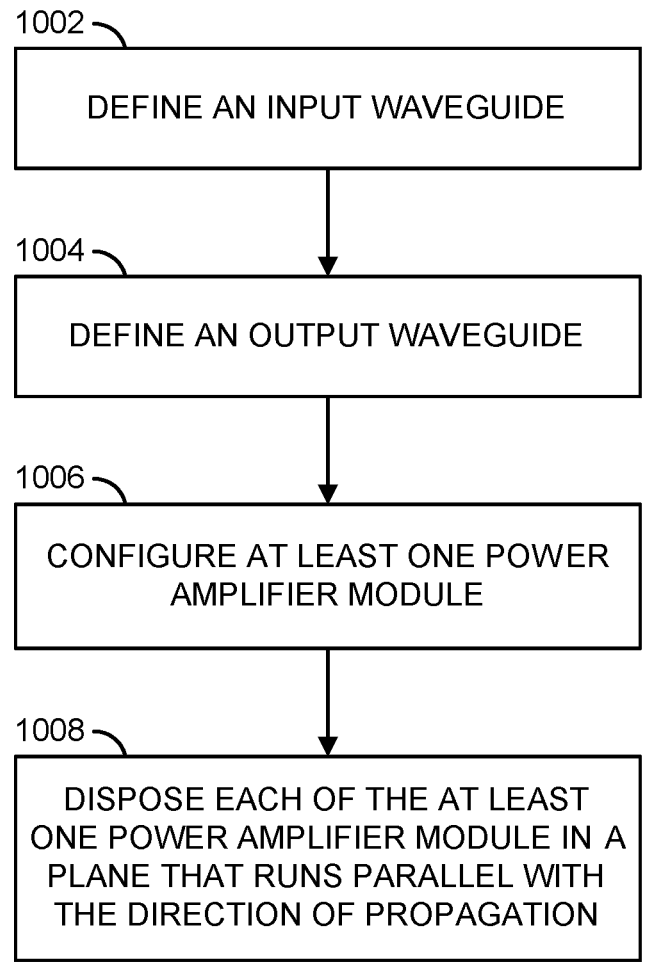

FIG. 10 depicts a flow chart illustrating a computerized method for wave propagation via combining power from power amplifiers according to one embodiment of the invention.

DETAILED DESCRIPTION

Generally speaking, a differential dipole-based waveguide power combiner system may allow an input wave signal to be amplified using a spatial power combining technique via one or multiple power amplifier modules that extend into both an input waveguide and an output waveguide. Moreover, a power amplifier module may include at least an input dipole antenna and an output dipole antenna which may jointly differentially drive a pair of amplifiers. In operation, for example, an input wave signal may enter the input waveguide of the system that includes two power amplifier modules that both include input dipole antennas that extend out into the cavity of the waveguide. Focusing on only one power amplifier module briefly, the input dipole antenna associated with a specific power amplifier module may detect the wave signal and may differentially drive a pair of active amplifiers on the specific power amplifier module. For example, one of the two arms of the input dipole antenna may be coupled to a corresponding one of the pair of amplifiers disposed on the same power amplifier module. In turn, the active microwave amplifiers may amplify the wave signal and propagate the amplified wave signal out on the output dipole antenna (that extends into the cavity of the waveguide) to be radiated into the output waveguide. When this technique is applied to each of the two power amplifier modules, in continuing this example, the power from each amplified wave signal propagated may combine with each other to produce a sufficiently strong signal to radiate to a satellite.

Advantageously, the differential dipole-based waveguide power combiner system may use dipole antennas printed on a dielectric substrate, such as printed circuit boards (PCB), or fabricated directly into a single-chip integrated circuit (IC), to be discussed more in FIG. 9. Dipole antennas beneficially may be designed to be much shorter in length in the direction of propagation of the wave signal, opposed to gradually tapered slotline, finline, etc. antennas. Utilizing shorter antennas, such as dipole antennas, may allow or enable a designer to not only construct a smaller, lighter weight power combiner, but additionally may reduce the dielectric and conductor combining losses that scale as the length of the antenna becomes longer. Dipole antennas also advantageously may be designed to handle broadband signals. Because PCBs and ICs may be used to build a power amplifier module for the differential dipole-based waveguide power combiner system, the costs, time, and defects for manufacturing a power amplifier module (and overall power combiner) is greatly reduced. There is no longer a need to "hand tune" each power amplifier module as is conventionally performed. Because, the amplifiers utilized in the power combiner system are not coupled at DC, they exhibit much better stability due to the elimination of low frequency oscillations and noise. In addition, this technique does not require any connection from the input or output dipole antennas to a ground plane, eliminating the need for vias or other transitions that will further limit the bandwidth and performance.

Furthermore, the differential dipole-based waveguide power combiner system may utilize differentially driven amplifiers, opposed to single-ended structures (i.e., measuring voltage between an input channel and the ground). The differentially driven amplifiers beneficially may operate in a "push-pull" manner that greatly may help attenuate and suppress even order harmonics when the impedance is sufficiently matched. This even order harmonic suppression may especially beneficial for applications that are highly dependent on linearity and harmonic content. Additionally, a designer may advantageously design a power combiner to include a wide range of available powers by simply scaling the number of trays incorporated in the power combiner.

Importantly, the differential dipole-based waveguide power combiner system may be capable of being scaled to amplify much higher frequencies than conventional power combiners. For example, the differential dipole-based waveguide power combiner system may be designed to handle the centimeter band, millimeter band, and even submillimeter band (~300 GHz) using IC fabrication and processing techniques.

Figure 1:
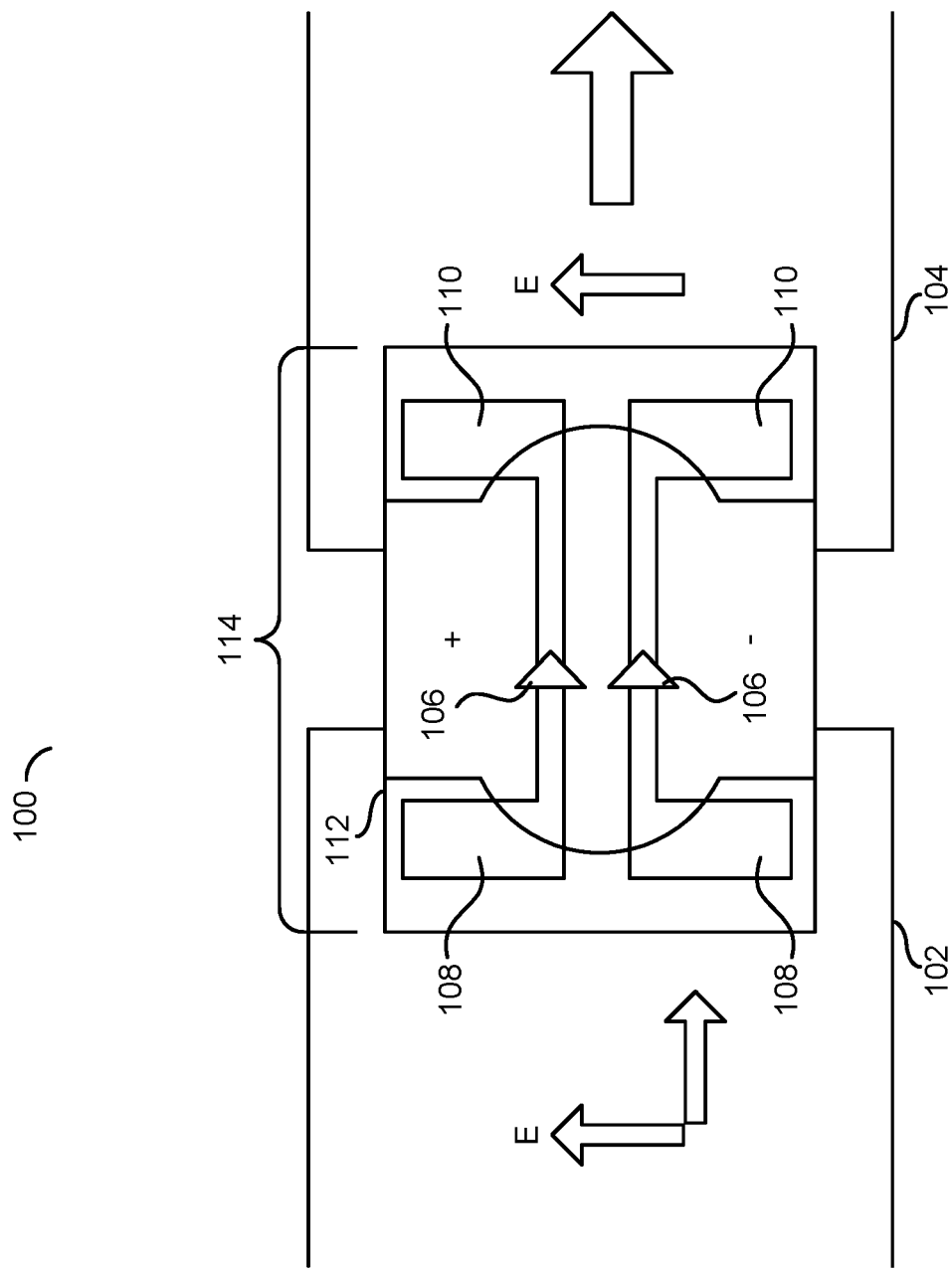
FIG. 1 illustrates a side view diagram of an exemplary differential dipole-based power combiner that includes an input waveguide, an output waveguide, and a power amplifier module that includes input and output dipole antennas according to one embodiment of the invention.

As shown in FIG. 1, a differential dipole-based waveguide power combiner system 100 may include an input waveguide 102, an output waveguide 104, and at least one amplifier 106 that may be disposed between (and additionally overlapping or extending into) the input waveguide 102 and the output waveguide 104 organized as a power amplifier module 114 according to one embodiment of the invention. The power amplifier module 114, as depicted in FIG. 1, may include an input dipole antenna 108 that may include a first input arm and a second input arm. The power amplifier module 114 may include an output dipole antenna 110 that may include a first output arm and a second output arm, and a pair of differentially driven amplifiers 106. Each input arm of the input dipole antenna 108 may include an input antenna portion and an input microstrip portion that may be coupled to a corresponding one of the amplifiers 106. Similarly, each output arm of the output dipole antenna 110 may include an output antenna portion and an output microstrip portion that may be coupled to a corresponding one of the amplifiers 106.

As described above, each amplifier of the pair of differentially driven amplifiers may be coupled to one of the input microstrips and to one of the output microstrips, as shown in FIG. 1. In this way, for example, when an input wave signal transfers power from the input waveguide to one or both of the input antenna portions, the wave signal may be directed to the corresponding input microstrips and then feed to the corresponding amplifier. Because each amplifier in FIG. 1 is coupled to a different arm of the input dipole antenna, each amplifier is differentially driven (feed the wave signal in a "push-pull" manner) and remains 180 degrees out of phase with the other amplifier.

As illustrated in FIG. 1, the input dipole antenna 108 may extend into the input waveguide 102 (i.e., physically protrude into the cavity of the input waveguide 102) so that when an input wave signal propagates down the input waveguide 102, the energy of the input wave signal may be transferred from the input waveguide 102 to the amplifiers 106 via the input dipole antenna 108. Likewise, the output dipole antenna 110 may extend into the output waveguide 104 (i.e., physically protrude into the cavity of the output waveguide 104) so that when an amplified wave signal propagates onto the output dipole antenna 110, the energy of the amplified wave signal may be transferred from the amplifiers 106 to the output waveguide 104 via the output dipole antenna 110 in a direction shown by the red arrow. Although the system 100, as shown in FIG. 1, is implemented using only one power amplifier module 114, it is contemplated that any number power amplifier modules may be implemented without departing from the scope or spirit of the invention.

Figure 3B:
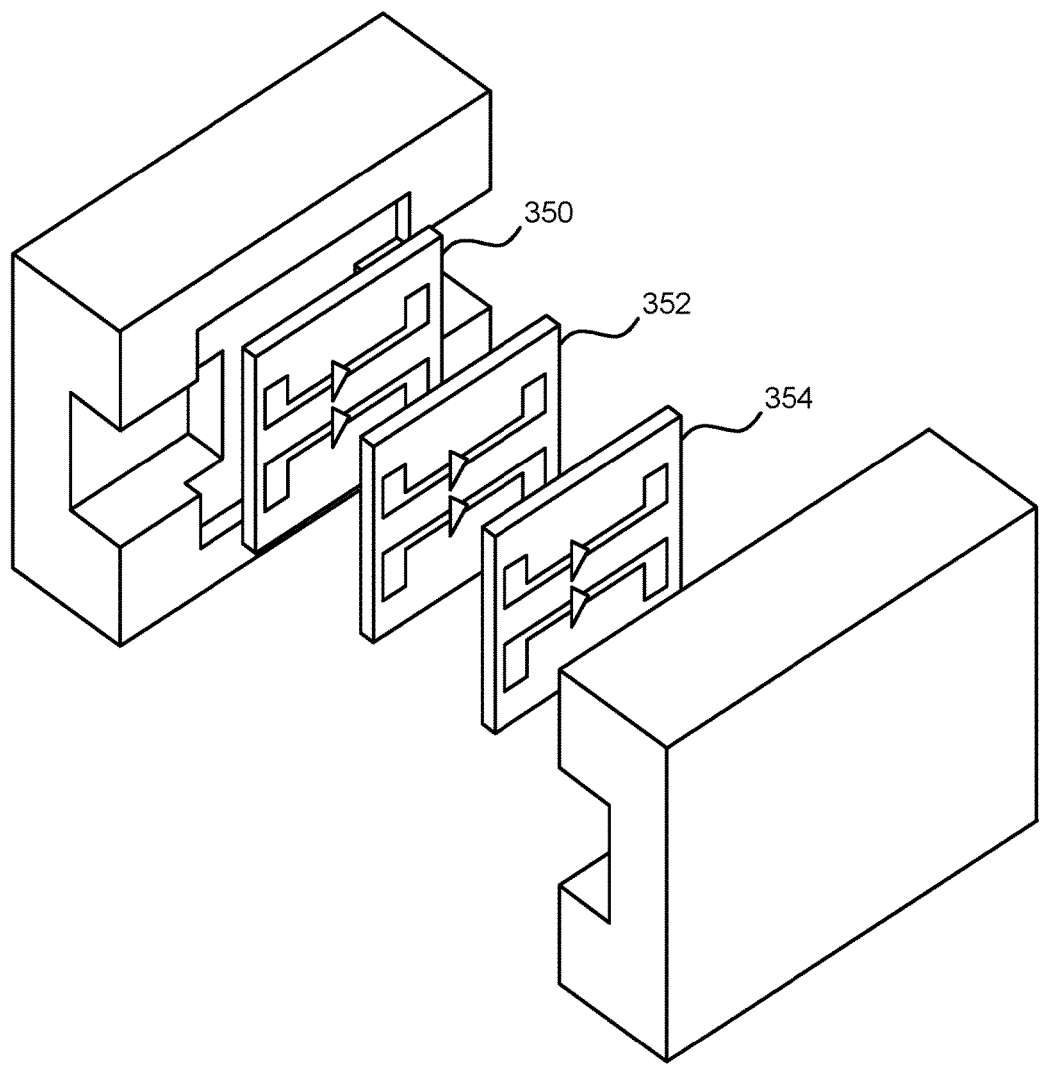
FIG. 3B illustrates another exploded view of one possible way of achieving this equal power distribution when three power amplifiers modules are present according to one embodiment of the invention.

Additionally, the power amplifier module 114 may include a backside sheet 112 that may be a coating, a printing, or any other suitable manner to affix a conductive material (i.e., conductive metals, etc.) that is disposed on the opposite side of the power amplifier module 114 from the dipole antennas and amplifiers. In one embodiment, the backside sheet may include patterns or may be shaped into any pattern to provide better matching to the radiated wave signal. For example, as shown in FIG. 1, the area between dashed lines denote the presence of a metal backside sheet and the absence of metal elsewhere helps to better match to the radiated wave signal. It is also to be understood that while FIG. 1 merely shows one power amplifier module 114 of the system 100, a designer may advantageously design a power combiner to include a wide range of available powers by simply scaling the number of power amplifier modules incorporated in the power combiner without departing from the scope and spirit of the invention. Another example is shown in FIG. 3A and FIG. 3B.

Figure 2:
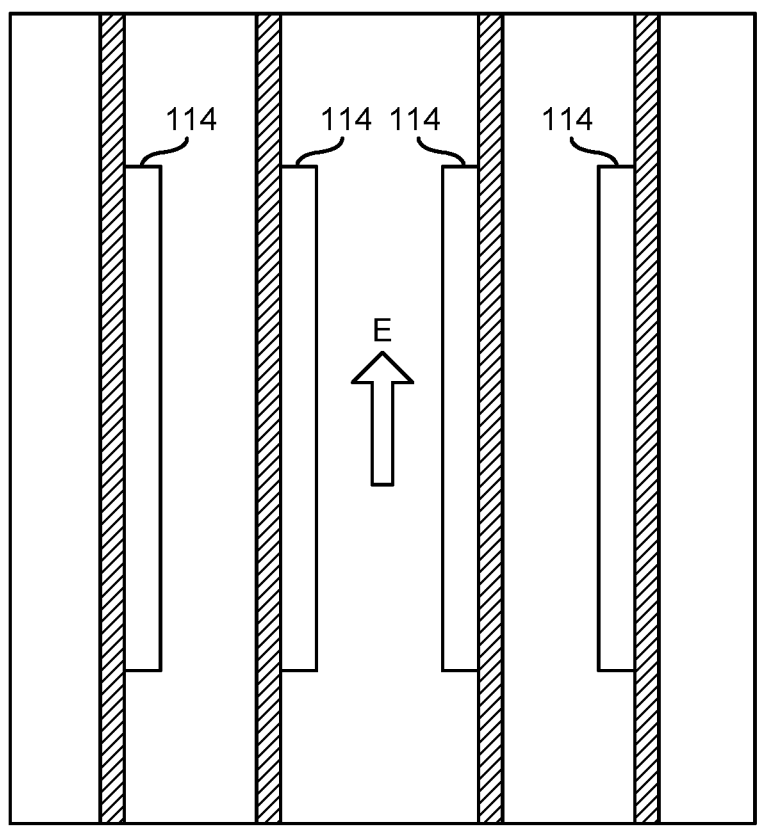
FIG. 2 illustrates an end view (i.e., view from the input waveguide into the output waveguide) diagram of an exemplary dipole-based waveguide power combiner that includes four power amplifier modules arranged in the plane orthogonal to the direction of energy propagation according to one embodiment of the invention.

As shown in the different waveguide cross section perspective of FIG. 2, the differential dipole-based waveguide power combiner system 100 may include several power amplifier modules 114, four in this example in FIG. 2. In this illustration, the power amplifier modules 106 may be disposed of in a position that is parallel with the plane defined by the direction of the electric field and the direction of wave propagation. Moreover, each of the four power amplifier modules 114, in this continued example and not as a limitation, may be located from other power amplifier modules 114 in a plane orthogonal to the direction of wave propagation, as illustrated in FIG. 2. Each power amplifier module 114 may be situated in the power combiner to face toward the center vertical axis of the waveguide (as shown) or away from the center vertical axis of the waveguide. Additionally, the modules 114 may be situated so that they all face the same way (either left or right). In one embodiment, structural conductive material spacers may be disposed between each power amplifier module to provide proper placement in the waveguide for each power amplifier module 114 and to help dissipate heat (discussed below). Furthermore, although the power amplifier modules 114 of FIG. 2 are positioned in the plane defined by the electric field and the direction of propagation, the power amplifier modules 114 (or single power amplifier module in some cases) may be positioned in any other plane that is at least defined by the direction of propagation. For example, as shown in FIG. 2, one or more of the power amplifier modules 114 may be re-positioned at any degree of rotation relative to the electric field in some implementations.

As illustrated in FIG. 3A, this exemplary power combiner system 300 may include two power amplifier modules 302 that are situated between two end structural waveguide portions 304, 306 and a center structural spacer portion 310 that may be disposed between the two power amplifier modules 302 according to one embodiment of the invention. In this example, the two power amplifier modules 302 may be a fabricated single-chip IC or constructed using a PCB in conjunction with active devices such as a differential amplifier. As shown in FIG. 3A, some implementations include printing metal traces only on a front side 312 of the power amplifier module to form the input dipole antenna, such as 108 in FIG. 1, and the output dipole antenna, such as 110 in FIG. 1. Because the two or more antennas are printed on the front side 312 of the power amplifier module 302 only, the system 300 with the two arms of the dipole antenna do not require any interconnection to a backside 308 of the power amplifier module 302. By removing the interconnections between the front side 312 and the backside 308, any potential grounding issues may be reduced or eliminating in electromagnetic signal interference.

To further provide better matching to the radiated wave signal, the backside 308 of the power amplifier module 302 may additionally include a backside sheet of metal, as described above, in any number of patterns.

In some embodiments, despite the power amplifier modules of FIGS. 1 and 3 looking similar, in some applications it may be beneficial for each power amplifier module 302 to not be identical in all characteristics but rather include different designs, properties, or attributes for each power amplifier module 302. For example, it is accepted that a combined wave signal may ideally perform best when each amplifier coupled to each corresponding dipole antenna saturates at the same time. Generally, to achieve equal saturation of each amplifier in one example, a designer may employ symmetry in the power combiner to achieve the best performance depending on the properties of the waveguide. For instance, each dipole antenna may be symmetrically positioned in the waveguide in such a way to complement each other dipole antenna in the waveguide so that all amplifiers contribute equally to combining power.

However, when symmetry cannot be exploited, some differential dipole-based waveguide power combiner system embodiments may allow properties of a particular dipole antenna to be altered. For example, the dipole antenna's location, size, material properties, shape, length, depth within a waveguide, positioning, material printed, etc., may be altered. In such embodiments, the coupling amplitude and phase of the corresponding amplifier(s) associated with the dipole antenna may be sufficiently similar to the coupling amplitude and phase of each other amplifier in the waveguide. For example, a power amplifier module situated in the center axis of the waveguide may naturally couple more strongly than the power amplifier modules located near the edges of the waveguide. As a result, some attribute(s) of the middle power amplifier module, in this example, may be changed in order to weaken the coupling effect so that the amplitude distribution is more equal relative to the power amplifier modules located near the edges of the waveguide.

To further illustrate, FIG. 3B shows an exploded view of one such possible way of achieving this equal power distribution when three power amplifier modules are present according to one embodiment of the invention. In this illustrative example, one attribute that may include shortening the dipole antenna in the middle power amplifier module, such as a power amplifier module 352 relative to the length of the dipole antennas in the edge power amplifier modules, such as power amplifier modules 350 and 354. There are numerous other ways of altering specific attributes of the power amplifier module to achieve an equal amplitude balance. Another attribute to be altered may include the distance a dipole antenna for a particular power amplifier module may extend into the input waveguide and the output waveguide. Yet another example is to construct the power amplifier modules on printed circuit boards with different material properties (board thickness, dielectric constant, etc.). In one embodiment, the at least one power amplifier modules is configured to be disposed among the at least one power amplifier modules as a function of one or more attributes, including one that is illustrated in FIG. 3B.

As an example, to help equalize the coupling effect between a center power amplifier module and edge power amplifier modules, the dipole antennas of the edge power amplifier modules may be adjusted, for example according to the different attributes above, so that the dipole antennas extend further into input waveguide and the output waveguide. In accordance with such embodiments, the wave signal from the dipole antennas in the edge power amplifier modules may be strengthened, thus equalizing the amplitude distribution among all the modules.

In another embodiment, it may be desirable to equalize a phase shift, in addition to the amplitude, among each amplifier of a power amplifier module in a power combiner in order to further improve the performance of the power combiner. In another example, a power combiner may additionally include a phase shifter (not shown) that is positioned between an amplifier and a dipole antenna and is capable of shifting the phase of a signal. A phase shifter may include a component or may be implemented via utilizing a delay line (e.g., between a power amplifier and a dipole antenna) for specific dipole antenna that is longer than another delay line for another probe. As an example, to equalize the phase of a coupling between power amplifier modules in a power combiner, the length of arms of a dipole antenna or even the length of the input microstrip between the antenna portion and the amplifier may change the phase of the coupling.

Figure 4:
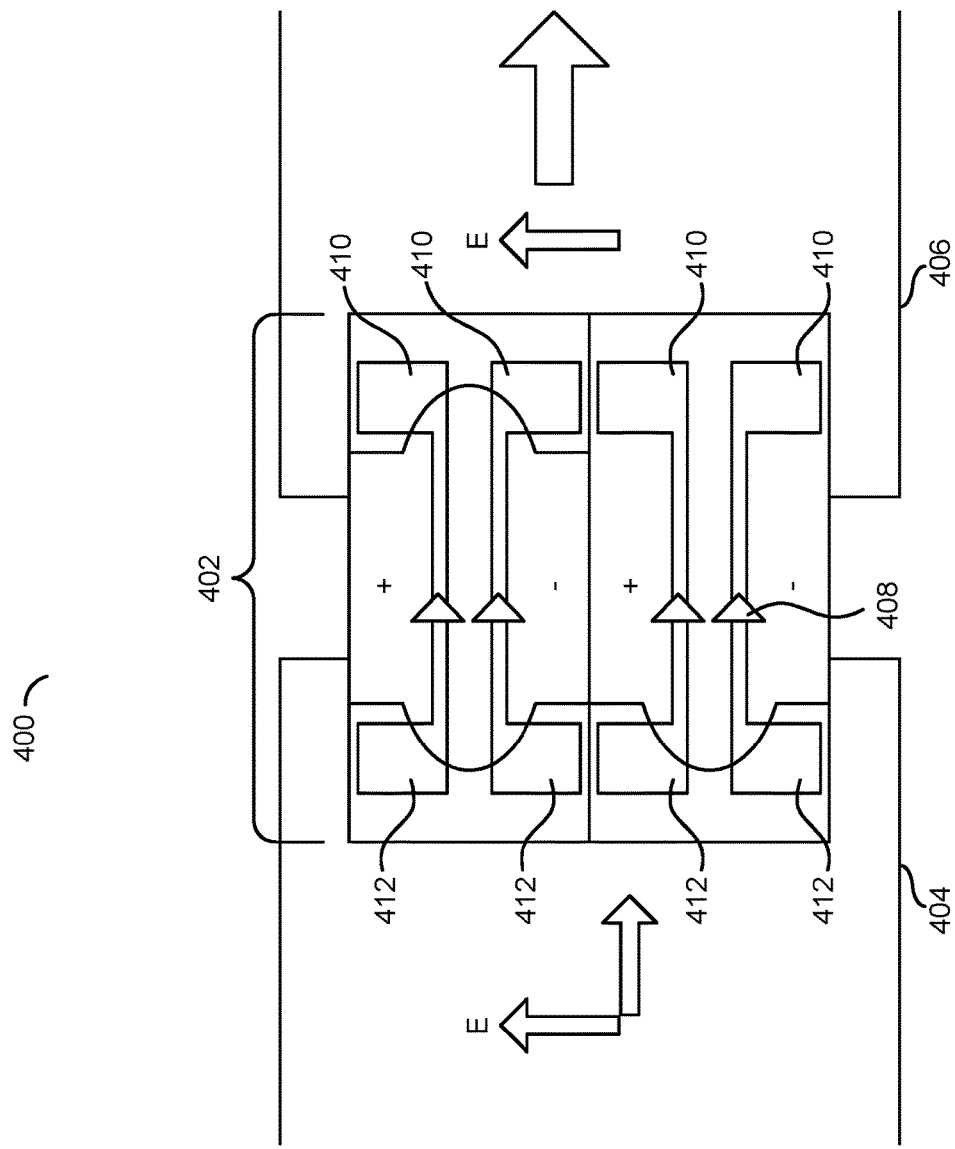
FIG. 4 illustrates a side view diagram of an exemplary differential dipole-based power combiner that includes an input waveguide, an output waveguide, and a power amplifier module in which the power amplifier module includes input and output dipole antennas and four power amplifiers according to one embodiment of the invention.

According to another embodiment, as shown in FIG. 4, a side view diagram illustrates an exemplary differential dipole-based power combiner system 400 that may include a power amplifier module 402 having an input waveguide 404, an output waveguide 406, and a amplifiers 408 in which the power amplifier module includes several input and output dipole antennas and four amplifiers 408 according to one embodiment of the invention. In this embodiment, the power amplifier module 402 may include stacking the antennas and amplifiers 408 in the direction of the electric field. In this example, a pair of input dipole antennas 412 feed into two pairs of amplifiers 408. These four (two pairs) of amplifiers 408 drive a pair of output dipole antennas 410. Stacking the amplifiers in this manner does improve the total number of devices that can be combined, and increases the overall output power. However, overheating remains a potential problem in using one of these densely-packed power amplifier modules.

However, as illustrated in FIG. 5, an end view (i.e., view from the input waveguide into the output waveguide) diagram of an exemplary differential dipole-based waveguide power combiner, as shown in FIG. 3A, that includes two power amplifier modules disposed in the plane orthogonal to the direction of energy propagation and that dissipate heat into the metal block of the waveguide according to one embodiment of the invention, the heat show by the arrows may be more efficiently dissipated from one of these double power amplifier modules 502 because the power amplifier modules are favorably positioned toward the center vertical axis of the waveguide (for greatest vertical axis heat dissipation) and are mounted flush against or directly adjacent to the end structural waveguide portions that are generally constructed from metal (for greatest surface area to transfer the greatest heat). The rise in temperature remains minimal as a result.

Referring now FIG. 6 and FIG. 7 together, FIG. 6 depicts a three dimensional computer model view of an exemplary differential dipole-based waveguide power combiner that includes two power amplifier modules, as shown in FIG. 3A according to one embodiment of the invention. Only half of the structure is shown to reduce simulation time. FIG. 7 is a graph depicting the coupling matching performance for a simulated double power amplifier modules at the Ku band, as illustrated in FIG. 6, during a particular modelling experiment. Moreover, in one embodiment, the power combiner tested revealed that the power combiner is well matched by achieving better greater than a 20 dB output return loss across the band from 13 to 15 GHz and by exhibiting power losses of approximately 0.2 dB.

Referring now to FIG. 8, a diagram illustrates an exemplary differential dipole-based waveguide power combiner computer model design of a substrate formed power amplifier module as situated in a waveguide according to one embodiment of the invention. For example, a differential dipole-based waveguide power combiner computer model design includes an input waveguide 802, an output waveguide 804, input dipole antennas 806, output dipole antennas 808, and amplifiers 810. In such an embodiment, a portion of the differential dipole-based waveguide power combiner system 800 may use a dielectric printed substrate. In such a design, the system 800 may include amplifiers 810 that may be disposed between (and additionally overlapping or extending into) the input waveguide 802 and the output waveguide 804. The power amplifier modules, as depicted in FIG. 8, includes the input dipole antenna 806 that includes a first input arm and a second input arm, and the output dipole antenna 808 that includes a first output arm and a second output arm, and a pair of differentially driven amplifiers 810. The power amplifier module shown in FIG. 8 may use a printed circuit board (PCB) to support the input and output dipole antennas.

On the other hand, for an application that may require extremely high frequencies, a single-chip IC differential dipole-based waveguide power combiner system 900 which may include an input dipole antennas 901, output dipole antennas 902, and corresponding amplifiers 903 integrated directly onto the semiconductor chip, as shown in FIG. 9. For example, the power combiner system 900 may be incorporated in a form of monolithic microwave integrated circuit (MMIC). This approach eliminates the losses associated with wire bonds connecting the amplifiers to the antennas, improving the performance. In an alternative embodiment, aspects of the invention may further coupled or controlled by computer executable instructions, software programming products or software modules executable by processors to power optimization of such a system. For example, using the power combiner system 900 as an example and not as a limitation, embodiments of the invention may include software controller to regulate the frequency, power combining coefficient, and other parameters to further fine-tune or calibrate the power combiner system 900. In such an example, it is to be understood that other sensors or detectors may be coupled to the software or the power combiner system 900.

In another embodiment, aspects of the invention may be incorporated in a manufacturing process of a power amplifier system, such as those incorporating integrated circuits. For example, referring now to FIG. 10, a flow chart illustrating a computerized method for wave propagation via combining power from power amplifiers according to one embodiment of the invention. In this example, the computerized method may be stored or instantiated in a computer readable medium for processing by processors. The processors are also coupled to sensors, controllers, or other hardware devices to create the embodiments described above. For example, a computerized method may be employed to define an input waveguide at 1002 and to define an output waveguide at 1004. The method further includes configuring at least one power amplifier module at 1006. Each of the power amplifier module includes a plurality of amplifiers; at least one input dipole antenna extending into the input waveguide with each input dipole antenna including two input dipole antenna arms; and at least one output dipole antenna extending into the output waveguide with each output dipole antenna including two output dipole antenna arms. As previously illustrated in FIG. 1, for example, each of the power amplifier module may include a pair of differentially driven amplifiers. Each input arm of the input dipole antenna may include an input antenna portion and an input microstrip portion that may be coupled to a corresponding one of the amplifiers. Similarly, each output arm of the output dipole antenna may include an output antenna portion and an output microstrip portion that may be coupled to a corresponding one of the amplifiers. As described above, each amplifier of the pair of differentially driven amplifiers may be coupled to one of the input microstrips and to one of the output microstrips, as shown in FIG. 1, to create the differential waveguide power combining. The method further includes disposing each of the at least one power amplifier module in a plane that runs parallel with the direction of propagation at 1008.

Still further, the figures depict preferred embodiments of a differential dipole-based waveguide power combiner system for purposes of illustration only. One skilled in the art will readily recognize from the foregoing discussion that alternative embodiments of the structures and methods illustrated herein may be employed without departing from the principles described herein. Thus, upon reading this disclosure, those of skill in the art will appreciate still additional alternative structural and functional designs for a differential dipole-based waveguide power combiner system and a process for equalizing coupling effect and phase for an output wave signal through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The invention claimed is:

1. An apparatus comprising:
   a plurality of amplifiers;
   at least one input dipole antenna extendable into an input waveguide and connected to the amplifiers; and
   at least one output dipole antenna extendable into an output waveguide and connected to the amplifiers, wherein the input dipole antenna is disposed in a plane that runs parallel with a direction of propagation of a wave signal in the input waveguide.

2. The apparatus of claim 1, wherein each of two arms of the input dipole antenna is configured to couple to an input node of a corresponding one of the amplifiers.

3. The apparatus of claim 1, wherein each of two arms of the output dipole antenna is configured to couple to an output node of a corresponding one of the amplifiers.

4. The apparatus of claim 1, wherein the input dipole antenna is configured to differentially drive a pair of the amplifiers in response to the wave signal.

5. The apparatus of claim 4, wherein the amplifiers combine a plurality of output powers to propagate the wave signal in the output waveguide.

6. The apparatus of claim 1, wherein the amplifiers form at least one differentially driven amplifier.

7. The apparatus of claim 1, further comprising a phase shifter disposed between (i) one of the amplifiers and (ii) the input dipole antenna or the output dipole antenna.

8. The apparatus of claim 1, wherein the input dipole antenna and the output dipole antenna are disposed on one side of a substrate.

9. The apparatus of claim 8, wherein another side of the substrate includes a design pattern configured to enhance radiation of the wave signal into the output waveguide.

10. An apparatus comprising:
   a plurality of first amplifiers;
   at least one first input dipole antenna extendable into an input waveguide and connected to the first amplifiers;
   at least one first output dipole antenna extendable into the an output waveguide and connected to the first amplifiers;
   a plurality of second amplifiers;
   at least one second input dipole antenna extendable into the input waveguide and connected to the second amplifiers; and
   at least one second output dipole antenna extendable into the output waveguide and connected to the second amplifiers, wherein each of the first input dipole antenna and the second input dipole antenna are disposed in a plane parallel with a direction of power propagation in the input waveguide.

11. The apparatus of claim 10, wherein (i) the first input dipole antenna is disposed relative to the second input dipole antenna as a function of one or more attributes and (ii) the attributes include at least one of (a) positions of the first input dipole antenna and the second input dipole antenna, (b) sizes of the first input dipole antenna and the second dipole antenna, (c) shapes of first input dipole antenna and the second dipole antenna, (d) material construction of the first dipole antenna and the second dipole antenna or (e) any combination thereof.

12. The apparatus of claim 10, wherein (i) each of the first input dipole antenna comprises two input arms and (ii) each of the first output dipole antenna comprises two output arms.

13. The apparatus of claim 12, wherein (i) each of the input arms of the first input dipole antenna is configured to couple to an input node of a corresponding one of the first amplifiers and (ii) each of the output arms of the first output dipole antenna is configured to couple to an output node of a corresponding one of the plurality of the first amplifiers.

14. The apparatus of claim 10, wherein (i) each of the second input dipole antenna comprises two input arms and (ii) each of the second output dipole antenna comprises two output arms.

15. The apparatus of claim 14, wherein (i) each of the input arms of the second input dipole antenna is configured to couple to an input node of a corresponding one of the second amplifiers and (ii) each of the output arms of the second dipole antenna is configured to couple to an output node of a corresponding one of the second amplifiers.

16. The apparatus of claim 10, wherein the first input dipole antenna is configured to differentially drive two of the first amplifiers in response to a wave signal in the input waveguide.

17. The apparatus of claim 16, wherein the second input dipole antenna is configured to differentially drive two of the second amplifiers in response to the wave signal in the input waveguide.

18. The apparatus of claim 10, wherein (i) the first amplifiers, (ii) the second amplifiers or (iii) the first amplifiers and the second amplifiers form at least one differentially driven amplifier.

19. The apparatus of claim 10, wherein (i) at least one property of the first amplifiers differs from at least one property of the second amplifiers and (ii) the property includes at least one of (a) a gain of the first amplifiers relative to the second amplifiers, (b) an amplitude balance of a plurality of wave signals generated in the output waveguide by the first amplifiers and the second amplifiers, (c) a strength of the wave signals generated in the output waveguide by the first amplifiers and the second amplifiers or (d) any combination thereof.

20. The apparatus of claim 10, wherein (i) the first amplifiers, (ii) the second amplifiers power, or (iii) the first amplifiers and the second amplifiers are constructed on an integrated circuit.

* * * * *